United States Patent [19]

Malbe et al.

[11] Patent Number: 4,996,588
[45] Date of Patent: Feb. 26, 1991

[54] DEVICE FOR INTERCONNECTION AND PROTECTION OF A BARE MICROWAVE COMPONENT CHIP

[75] Inventors: Serge Malbe, Gif sur Yvette; Evelyne Da Silva, Massy; Alain Fouché, Paris, all of France

[73] Assignee: Thomson Hybrides et Microondes, Paris, France

[21] Appl. No.: 326,646

[22] Filed: Mar. 21, 1989

[30] Foreign Application Priority Data

Mar. 25, 1988 [FR] France ................... 88 03950

[51] Int. Cl.$^5$ ............... H01L 23/02; H01L 23/12; H01L 39/02
[52] U.S. Cl. ....................................... 357/80; 357/74; 357/81
[58] Field of Search ................ 357/74, 80, 81; 361/380, 400

[56] References Cited

U.S. PATENT DOCUMENTS 3,290,564 12/1966 Wolff, Jr. ..................... 357/80
3,927,815 12/1975 Mase et al. .................. 357/80 X
4,276,558 6/1981 Ho et al. .
4,423,468 12/1983 Gatto et al. .

FOREIGN PATENT DOCUMENTS 2507409 6/1981 France .
0269349 11/1987 Japan ..................... 357/74

OTHER PUBLICATIONS

Patent Abstracts of Japan, vol. 6, No. 132 (E-119) [1010], Jul. 17, 1982; & JP-A-57 56 953 (Nippon Denki K.K.) 05-04-1982.
Patent Abstracts of Japan, vol. 5, No. 44 (E-50) [716], Mar. 24, 1981; & JP-A-55 166 941.
IBM Technical Disclosure Bulletin, vol. 24, No. 4, Sep. 1981, p. 2146, Armonk, N.Y., U.S.; N. Ainslie et al.: "Brazing preform for semiconductor package".
Patent Abstracts of Japan, vol. 8. No. 17 (E-223) [1454], Jan. 25, 1984; & JP-A-58 182 250 (Mitsubishi Denki K.K.) 10-25-83.
Patent Abstracts of Japan, vol. 10, No. 263 (E-435) [2319], Sep. 9, 1986; & JP-A-61 89 653 (Fujitsu Ltd) 05-07-86.

*Primary Examiner*—Rolf Hille
*Assistant Examiner*—Mahshid Saadat
*Attorney, Agent, or Firm*—Oblon, Spivak, McClelland, Maier & Neustadt

[57] ABSTRACT

In order to interconnect an unprotected bare chip of MMIC (microwave monolithic integrated circuit), a ceramic substrate carries a double-face circuit. A network of microstrip lines which radiate from the center to the periphery is disposed on the first face of said double-face circuit. The bare MMIC chip and its microwave environment is fixed on the second face which is metallized as a ground plane. The microwave circuit is interconnected with the network of microstrips by means of plugged metallized holes. A sole-piece provided with a housing for the MMIC is fixed on the ground plane. The first face can carry self-protected components.

11 Claims, 2 Drawing Sheets

DEVICE FOR INTERCONNECTION AND PROTECTION OF A BARE MICROWAVE COMPONENT CHIP

BACKGROUND OF THE INVENTION

1. Field of the Invention

The present invention relates to a device for interconnection and protection of a microwave integrated circuit chip formed of III-IV materials such as GaAs. The performances of a microwave integrated circuit mounted in said device are not reduced by this latter over a range of frequencies extending from the d.c. level to at least 40 Ghz and up to 60 GHz if the substrate is matched.

2. Description of the Prior Art

It is known that microwave integrated circuits, often known as MMICs for Microwave Monolithic Integrated Circuits, are difficult to use.

In the first place, these integrated circuits are very generally of GaAs or of comparable materials such as AlGaAs, InP, ..., and have a surface $Si_3N_4$ which does not provide optimum protection as in the case of a silicon circuit. They accordingly have to be protected against climato-mechanical stresses by an encapsulating package.

In addition, however, it is also known that a MMIC which operates well in the state of a bare chip suffers from considerable degradation of its characteristics when it is encapsulated within a package. Many parameters are involved, including the volume of the cavity of the package and the passage of the access connections through the package walls. These latter are either coaxial connections formed by glass beads (which is illogical since the circuit associated with a MMIC is very generally of microstrips) or flat connections which pass through the package in the plane of bonding of the cap on the base within the thickness of the glass layer but which exhibit microwave leakages.

Results which are nevertheless acceptable are obtained with complex, bulky and costly packages but:

these latter are not compatible with a microstrip circuit environment, they are not cascadable, this type of assembly being frequently employed in microwave circuits, they have relatively high insertion loss by reason of their system of access connections.

The device in accordance with the invention provides a solution to these problems of environment of a MMIC chip by adopting as a starting element a thin ceramic substrate which alone constitutes a portion of a microstrip circuit. In other words, this ceramic substrate supports the MMIC chip and the microstrip lines which serve to interconnect this element with other comparable elements (mounted in cascade) or with an external circuit of microstrips.

However, since the MMIC chip cannot be protected by a glass layer or a polymer drop, the chip is no longer placed, as in the prior art, on that face of the substrate which carries the microstrip interconnection and which normally constitutes the top face of a microwave circuit. On the contrary, the chip is placed beneath the substrate and protected by the fastening sole-piece of the device which also serves as a radiator, in which a local reduction in thickness offers a compartment for housing the MMIC chip and any other requisite components such as capacitors.

The MMIC chip and the other components which may be provided are connected to the network of microstrips of the top face by means of metallized holes which are hermetically plugged.

Thus the device in accordance with the invention is essentially constituted by a substrate etched on a double face, which carries on its bottom face at least one microwave component in the form of a bare chip protected by the fastening sole-piece in which is formed a compartment, and on its top face at least one network of microstrips and if necessary components such as capacitors, inductors and chips of glassivated silicon, the two faces being interconnected by means of metallized holes plugged with brazing alloy. I is readily apparent that the sole-piece is hermetically brazed on the double-face substrate.

The invention which has been primarily developed for integrated circuits applies also to microwave transistors.

SUMMARY OF THE INVENTION

In more precise terms, the invention relates to a device for interconnection and protection of a bare chip of microwave semiconductor component formed of group III-V materials, this device being distinguished by the fact that it comprises:

a thin substrate of dielectric material, a first face of which supports a network of microstrip lines and a second face of which supports a ground plane metallization for the microstrip lines of the first face, at least one chip of microwave semiconductor component fixed on the ground plane metallization of the second face of the substrate, which is connected electrically to the microstrip lines of the first face of the substrate by means of plugged metallized holes, a metallic sole-piece in which a recess provides a housing for the semiconductor component fixed on the second face of the substrate, the ground plane metallization of which is brazed on the sole-piece by means of a brazing preform.

DESCRIPTION OF THE PREFERRED EMBODIMENTS

Figure 1:
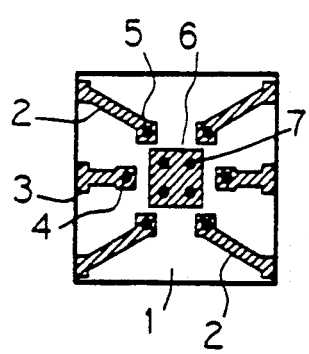
FIG. 1 is a plan view of the top face of the substrate of a device in accordance with the invention.
Figure 2:
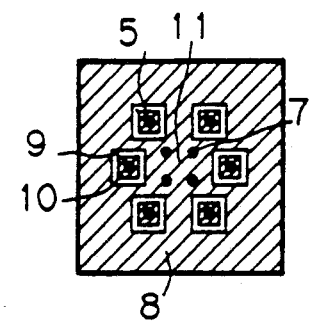
FIG. 2 is a plan view of the bottom face of the substrate of a device in accordance with the invention.

FIGS. 1 and 2 illustrate the substrate of the device in accordance with the invention. This is a ceramic wafer of square or rectangular shape having sides approximately 5 mm in length and a thickness of 0.25 to 0.75 mm. The wafer is preferably of alumina of 99.6% purity.

On a first face, in FIG. 1, which can be considered as the top face of the device under normal conditions of use, the substrate 1 supports a network of microstrip lines 2 which are directed from a central pad to the periphery of the substrate.

The number of microstrips 2 illustrated in the figures does not set any limitation on the scope of the invention: there are as many microstrips as may be required by the chip of the MMIC or transistor associated with said substrate. These microstrips are preferably formed by cathode sputtering, vacuum evaporation of metal or screen-process deposition. Similarly, they can terminate on the four sides of the substrate 1 as will be seen hereafter but the usual microwave circuit designs require that they terminate on at least two sides.

These microstrips have two distinctive features:
they both have two metallization pads 3 and 4 at both ends,
their "central" end with respect to the substrate 1 surrounds a hole 5 formed through the ceramic wafer.

The metallized pad 3 at the end located at the periphery of the substrate 1 makes it possible by means of the usual techniques to connect a lead or metallic strip so as to establish a connection with the external circuit in a microstrip environment. The metallized pad 4 at the "central" end with respect to the substrate 1 is pierced by a hole 5 and ensures an electrical contact with said metallized hole to which further reference will be made hereafter.

This microstrip face also has a central metallization pad 6 connected to the other face of the substrate 1 by means of at least one metallized hole 7.

The second face of the substrate 1 or bottom face in FIG. 2 is of the coplanar type : it is provided simply with a metallization 8 which constitutes the ground plane for the microstrip lines 2 of the first face. An etching operation performed in the metallization 8 creates reserves 9 which isolate small metallization pads 10 around the holes 5. The holes 7 are in electrical contact with the metallization 8.

The central area or pad 11 located on the ground plane 8 between the reserves 9 has sufficient dimensions to permit the attachment of a MMIC chip by brazing or conductive adhesive bonding, the chip substrate being therefore grounded to the ground plane 8.

All of the holes 5 and 7 which extend through the ceramic substrate 1 are metallized during the operation involving metallization of the two faces prior to etching, and are then plugged with a gold-tin or gold-germanium brazing paste. Remelting at a suitable temperature according to the brazing paste employed forms a hermetic seal within each hole.

The MMIC chip (or each chip) which is fixed on the bottom face of the substrate 1 is connected by means of leads or metallic strips to the metallized and plugged holes 5 which are in turn electrically connected to the network of microstrips 2. In the interconnection device according to the invention, the interconnection circuit is on a first face of the ceramic substrate and the microwave integrated circuit is on a second face of the same substrate and the connection is established by means of plugged metallized holes.

In the field of microwave frequencies, the circuit elements of the type described and provided with a small ceramic substrate are fixed in the majority of instances on a metallic sole-piece which has a double objective: transmission of heat generated during operation, handling for electrical measurement and fixing said microwave circuit element in position.

Figure 3:
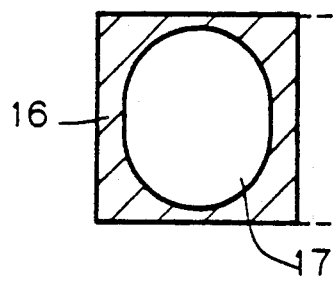
FIG. 3 is a plan view of the metallic sole-piece and of the brazing preform on the substrate.
Figure 3:
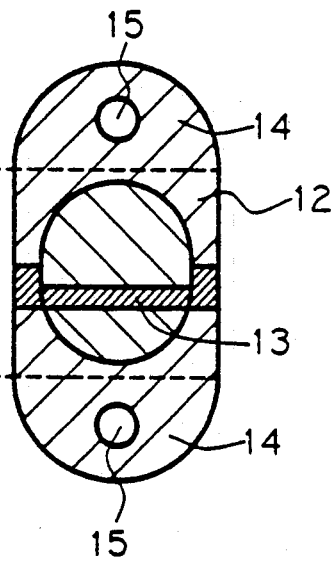

FIG. 3 is a plan view of the sole-piece of the interconnection device in accordance with the invention and, on one side, of the brazing preform of the sole-piece.

The metallic sole-piece of the device has at least a central portion 12, the dimensions of which are the same as those of the substrate 1. The thickness of the sole-piece is within the range of 0.5 to 1 mm. In order to permit the possibility of brazing it on the ground plane 8 of the substrate 1, said sole-piece is provided in its central portion with a portion 13 of reduced thickness, thus forming a compartment of approximately 0.25 to 0.30 mm in depth which is sufficient to house the MMIC chip. In order to show the profile of the sole-piece more clearly, its cross-section is superimposed on its plane in FIG. 3.

The sole-piece 12 can also be provided on two opposite sides with two metallic end-pieces 14, each pierced with a hole 15, which serve to fix the device on a support.

A brazing preform 16 serves to fix the sole-piece 12 hermetically on the ground plane 8 of the interconnection device. Said preform 16 also has the same dimensions as the substrate 1 and is provided with a central hole 17 in order to leave room for the MMIC chip and its ancillary connections and components.

Figure 4:
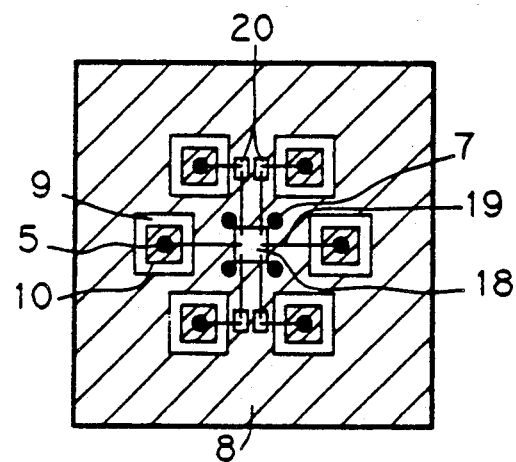
FIG. 4 is a plan view of the assembly of a MMIC chip on the bottom face of the substrate.

A plan view which is enlarged with respect to FIG. 2 shows in FIG. 4 the arrangement of the circuit on the bottom face of the interconnection circuit. At least one MMIC or transistor chip 18 is brazed on the central area 11 of the ground plane 8. By means of its connection pads, it is connected by leads or metallic strips 19 to an environment circuit which can include inductors (by the length of the leads 19), capacitors 20 or other semiconductor chips (not shown). In more general terms, this face of the ceramic substrate 1 has at least one bare chip of III-V material and all its environment for which the lengths of connections are crucial. The output of this circuit is established by connection with the plugged metallized holes 5 which are in contact with the microstrip circuit on the other face of the substrate.

Figure 5:
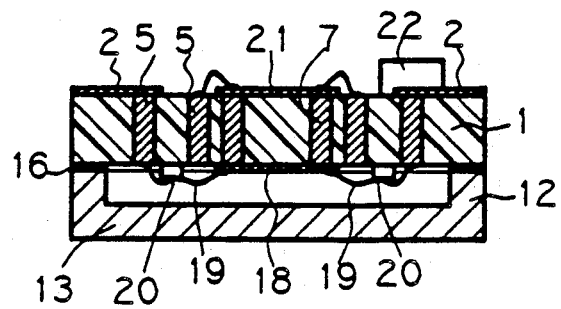
FIGS. 5 and 6 are sectional views of a device in accordance with the invention, in two embodiments.

The object of FIG. 5 which gives a sectional view of the device in accordance with the invention is to bring out the double-face aspect of the circuit. On the bottom face are located the immediate environment components of at least one bare chip 18 formed of GaAs, for example. This chip is protected against climato-mechanical stresses by the compartment formed in the sole-piece 12. On the top face, there is at least the network of microstrips 2 but provision may also be made for a complementary electronic circuit such as, for example, a voltage-regulating chip 21 of silicon which is glassivated or protected by a drop of varnish, one or a number of capacitors 22 of greater bulk, or a thermal radiator 23 (shown in FIG. 8). The presence of the plugged metallized holes 7 which puts the metallized pad 6 on the top face at the potential of the ground plane 8 on the bottom face makes it possible to deliver a regulated voltage, for example, to the MMIC chip by means of a hole 5.

The device in accordance with the invention and as illustrated in FIG. 5 corresponds to the case in which the sole-piece is limited to its central portion 12, without the end-pieces 14. This device can be bonded or brazed on a support. The double-face circuit ensures interconnection of the MMIC and the sole-piece ensures its protection. However, this is not an encapsulation package.

Figure 6:
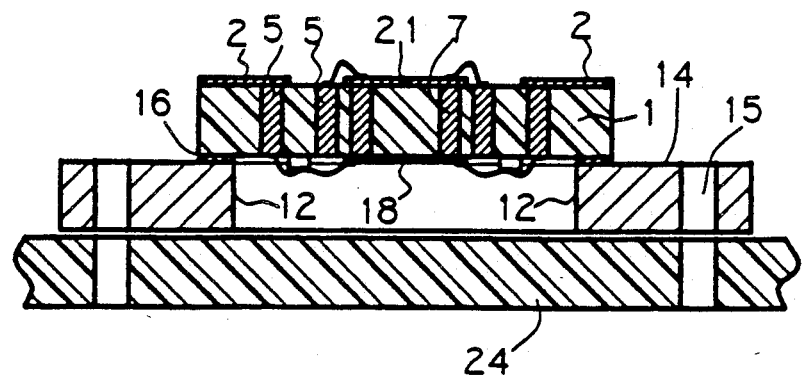

In fact, as shown in FIG. 6, the compartment within the sole-piece 12 can have a thickness equal to that of the sole-piece, which is pierced in this case. This type of device makes it possible to gain access to the microwave circuit of the MMIC on the bottom face of the substrate 1, to perform measurements thereon and to adjust said circuit, for example. In this case, the sole-piece is preferably provided with end-pieces 14. Thus in normal service, the sole-piece will be brazed and/or screwed on a support 24 which is substituted for the membrane 13 of the compartment so as to protect the MMIC chip. In this case the interconnection device is totally enclosed by means of the support 24 of ceramic material or of metal.

Figure 7:
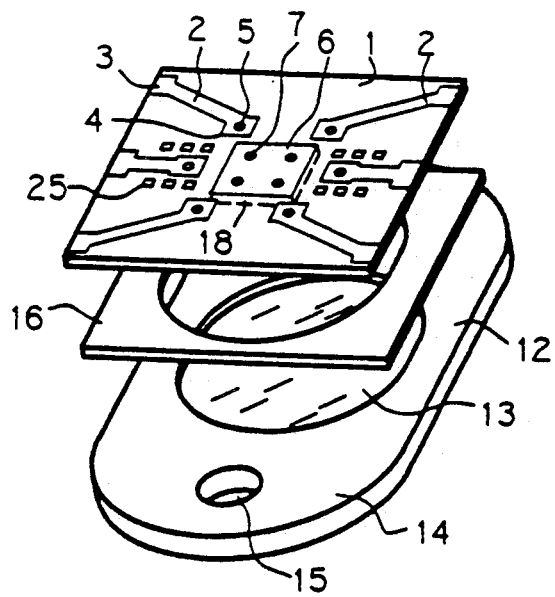
FIG. 7 is an exploded view of a device in accordance with the invention.

FIG. 7 is an exploded view of an interconnection device in accordance with the invention. The top face of the substrate 1 is purposely represented in this figure as having no component other than the microstrips 2 with their pads 3 and 4 and the plugged metallized holes 5 and 7, thereby avoiding the introduction of any confusion since the MMIC or integrated circuit 18 (shown in dashed outline) and its immediate environment are placed on the bottom face of the substrate 1.

The top face of said interconnection circuit can also be provided in proximity to the microstrips 2 with small metallized contact-studs 25 which serve to adjust the line impedance in accordance with known practice. This line impedance is also defined, in accordance with known laws, by the width of a microstrip line 2 and by the thickness and the dielectric constant of the substrate 1. By modifying these three parameters, it is therefore possible to obtain an interconnection network having line impedances which are perfectly matched with the frequency.

Accordingly, the device in accordance with the invention achieves the following performances:
transmission losses: 1 dB from 0 to 40 GHz
losses by reflection: $\leq 10$ dB from 0 to 40 GHz; these two values include the losses in transmission and by reflection of the measuring circuit,
insulation between each pair of microstrips: $>30$ dB from 0 to 20 GHz,
leak-tightness: $10^{-7}$ atm./cm$^3$/s for helium in the case of a circuit having a recessed sole-piece.

The cost of this interconnection circuit is low on condition that the sole-piece is a metal plate of simple shape, which is only hollowed-out at its center, and in which a passageway between the two faces of the circuit is established by means of holes plugged with a brazing cream.

Figure 8:
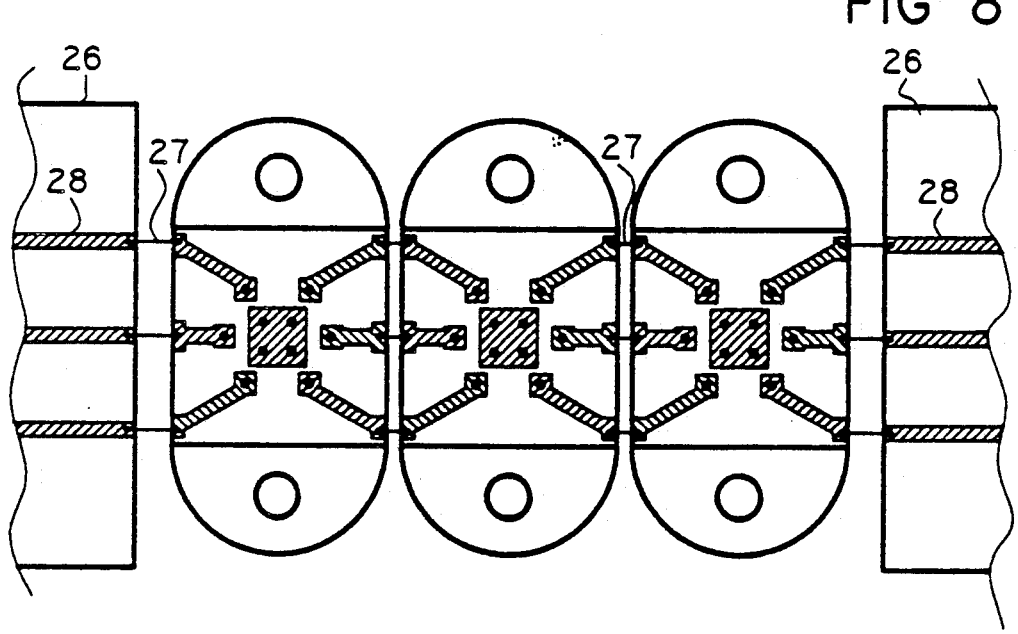
FIGS. 8 and 9 are views in plan and in cross-section showing a plurality of devices in accordance with the invention in a cascade-connected assembly.
Figure 9:
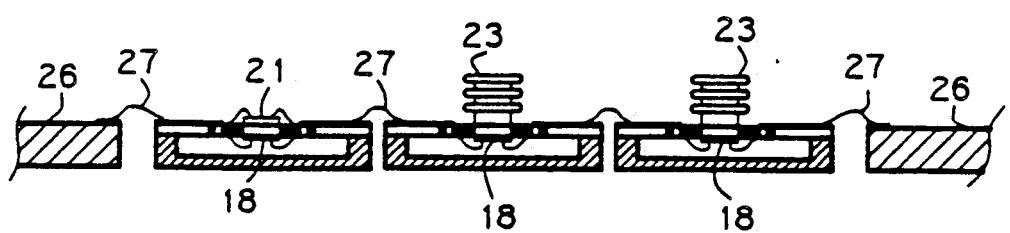

Since the interconnection network is of the microstrip type, it is perfectly suited to a microstrip environment without passing through coaxial connectors and is cascadable as shown in FIGS. 8 and 9.

These figures are respectively a plan view (FIG. 8) and a sectional view (FIG. 9) of three devices in accordance with the invention which are cascade-connected in an environment of microstrip circuits supported by a substrate 26 in the form of a single wafer or a plurality of wafers. The electrical connections are established by means of metallic strips 27 of practically zero length and connected by means of the usual techniques between the metallization pads 3 which are in mechanical contact, or between the pads 3 and the external microstrips 28 which are located in very close proximity. This is a matter of mechanical precision but there is no break in the microstrip lines which, in addition, are in the same plane: the top faces of the substrates 1 and 26. This is obtained by giving the sole-pieces the same lateral dimensions as the substrates.

As shown by way of non-limitative example in FIG. 9, the first interconnection circuit is provided on its top face with a voltage-regulating circuit 21 for supplying in parallel the MMICs 18 which are fixed on the bottom faces of the double-face substrates, and the two following interconnection circuits are each provided with a thermal radiator 23. For the sake of enhanced clarity of FIG. 8, the components mounted on the top face of the substrate are not shown in this figure.

The device for interconnection and protection of a bare chip of microwave component is employed for amplifiers, oscillators or other microwave circuits, within the range of 0 to 60 GHz.

What is claimed is:

1. A device for interconnection and protection of a bare chip of microwave semiconductor component formed of group III-V materials, in which the interconnection circuit is located on the first face of a ceramic substrate and the semiconductor component is located on the second face of said substrate, the connection between interconnection circuit and semiconductor component being established through the substrate by means of plugged metallized holes, wherein:

the substrate is of square or rectangular shape and is adapted to carry a network of microstrip lines on its first face, a first end of said microstrip lines being in close proximity to a central pad and a second end of said microstrip lines being located on one of the two opposite edges of the substrate, the second face of said substrate being adapted to carry a ground-plane metallization having a central pad formed between reserves which are necessary for insulation of said plugged metallized holes, said central pad being of sufficient size to permit attachment thereon of at least one bare chip of semiconductor component whose terminals are connected to the plugged metallized holes by means of wires or metallic strips, a metallic sole-piece, the central portion of which has the same dimensions as the substrate and has a portion of reduced thickness forming a compartment for housing the bare chip of semiconductor component, said sole-piece being fixed on the substrate by means of its ground plane metallization, said sole-piece being also provided on two opposite sides with two metallic end-pieces each pierced with a hole, the end-pieces being placed with respect to the substrate on the two other edges opposite to those which carry the second ends of the microstrip lines, thus making said interconnection device cascadable.

2. An interconnection and protection device according to claim 1, wherein the first face of the substrate is additionally provided at its center with a metallization pad joined by means of one plugged metallized hole to the ground plane metallization of the second face of the substrate so that said central metallization pad thus constitutes a pad for the transfer of a grounded component.

3. An interconnection and protection device according to claim 1, wherein the microstrip lines carried by the first face of the substrate are each provided at the end located on the edge of the substrate with a metallized pad for interconnecting the device with an external microstrip circuit such as another comparable cascade-connected device, by means of a metallic strip and without any rupture of impedance.

4. An interconnection and protection device according to claim 1, wherein the metallized holes which extend through the substrate are plugged by means of a gold-tin or gold-germanium brazing paste which is subjected to remelting, said holes being such as to traverse the microstrip lines and the metallization pads.

5. An interconnection and protection device according to claim 1, wherein the substrate supports a double-face circuit which additionally comprises:
   on its first and external face, self-protected components such as chips of silicon components, capacitors, radiators,
   on its second face and protected within the interior of the sole-piece compartment, microwave environment components of at least one bare component chip of III-V materials such as capacitors or inductors.

6. An interconnection and protection device according to claim 1, wherein the interconnection network constituted by the microstrip lines providing access to the bare microwave component chip is matched in impedance and in frequency by the width of the microstrip lines with respect to the thickness and to the dielectric constant of the substrate and adjusted by means of metallized contact-studs which are adjacent to the microstrip lines on the first face of the substrate.

7. An interconnection and protection device according to claim 1, wherein the microwave component is a bare integrated circuit chip (MMIC) of materials such as GaAs or AlGaAs.

8. An interconnection and protection device according to claim 1, further comprising a sealing means for fixing the sole-piece hermetically on the ground plane metallization of the second face of said substrate.

9. A device for interconnection and protection according to claim 1, wherein said sealing means comprises a brazing preform.

10. An interconnection and protection device according to claim 1, wherein the holes of the two metallic end-pieces are provided for attaching the device to a support so that the second ends of the microstrip lines, located on opposite sides of the substrate, are positioned for electrical connection to an adjacent microstrip circuit.

11. An interconnection and protection device according to claim 10, wherein the electrical connection of the microstrip lines to the adjacent microstrip circuit is established by metallic strips.

* * * * *